US010546644B2

(12) United States Patent
Chen

(10) Patent No.: US 10,546,644 B2
(45) Date of Patent: Jan. 28, 2020

(54) NAND FLASH MEMORY AND METHOD FOR DESTROYING INFORMATION FROM THE NAND FLASH MEMORY

(71) Applicant: GigaDevice Semiconductor (Beijing) Inc., Beijing (CN)

(72) Inventor: Minyi Chen, San Jose, CA (US)

(73) Assignee: GigaDevice Semiconductor (Beijing) Inc., Beijing (CN)

( * ) Notice: Subject to any disclaimer, the term of this patent is extended or adjusted under 35 U.S.C. 154(b) by 0 days.

(21) Appl. No.: 15/857,643

(22) Filed: Dec. 29, 2017

(65) Prior Publication Data

US 2019/0206496 A1 Jul. 4, 2019

(51) Int. Cl.
*G11C 16/16* (2006.01)
*G11C 16/30* (2006.01)

(52) U.S. Cl.
CPC .............. *G11C 16/16* (2013.01); *G11C 16/30* (2013.01)

(58) Field of Classification Search
None
See application file for complete search history.

(56) References Cited

U.S. PATENT DOCUMENTS

| 5,268,319 | A | * | 12/1993 | Harari | G11C 11/5621 |
| | | | | | 257/320 |
| 5,610,858 | A | * | 3/1997 | Iwahashi | G11C 16/0433 |
| | | | | | 365/185.06 |
| 9,317,422 | B1 | * | 4/2016 | Winters | G11C 16/22 |

* cited by examiner

*Primary Examiner* — Douglas King
(74) *Attorney, Agent, or Firm* — Gokalp Bayramoglu

(57) ABSTRACT

The present application provides a NAND flash memory, comprising: a control unit, which includes a signal receiving unit, a voltage boosted circuit and a flash array; and a power source supplying power to the control unit; wherein when the voltage boosted circuit receives an erase signal from the signal receiving unit, the voltage boosted circuit exerts a device erase pulse whose magnitude is larger than an initial voltage to blocks of the flash array to permanently erase data in the blocks; the blocks include power-on read blocks. By removing data from at least power-on read blocks, the present invention discloses a scheme for permanently destroying the NAND flash memory.

12 Claims, 2 Drawing Sheets

NAND FLASH MEMORY AND METHOD FOR DESTROYING INFORMATION FROM THE NAND FLASH MEMORY

TECHNICAL FIELD

The present application generally relates to the NAND flash memory technical field and, more particularly, to a NAND flash memory and a method for destroying information from the NAND flash memory.

BACKGROUND

Flash memory is an electronic (solid-state) non-volatile computer storage medium that can be electrically erased and reprogrammed. The NAND flash memory is a main type of flash memory named after the NAND logic gates, it has advantages of fast programming and short erasing time.

In NAND flash memory, the memory array is made of a large amount of memory units. Each memory unit stores a binaural data 0 or 1. Usually the memory units are arranged as an N×M array, which means a plurality of disks compose one memory array and used as a single disk. It stores data in strings in different disks. When data is accessed, related disks in the array are operated together, which reduces the data access time and improves the space usage.

With the widespread of NAND flash memory, data leakage become a serious problem. In view of this, it is necessary to develop destroy scheme to avoid information leakage.

SUMMARY

In light of above problems, there is provided a NAND flash memory and a method for destroying information from the NAND flash memory, which may overcome or at least partially solve or mitigate above problems.

According to an aspect of the present application, there is provided a NAND flash memory, comprising:
a control unit, which includes a signal receiving circuit, a voltage boosted circuit and a flash array; and
a power source supplying power to the control unit;
wherein when the voltage boosted circuit receives an erase signal from the signal receiving circuit, the voltage boosted circuit exerts a device erase pulse whose magnitude is larger than an initial voltage to blocks of the flash array to permanently erase data in the blocks; the blocks include power-on read blocks.

In a preferred embodiment of the present invention, the signal receiving circuit receives a device erase command from an external NAND controller and sends the erase signal to the voltage boosted circuit.

In a preferred embodiment of the present invention, the pulse width of the device erase pulse is 0.5 seconds to 10 seconds.

In a preferred embodiment of the present invention, the NAND flash memory according to claim 1, wherein the magnitude of the device erase pulse is between 20 volts and 30 volts.

In a preferred embodiment of the present invention, the number of erase pulse is one pulse.

According to the embodiment of the present application, there is disclosed a NAND flash memory and method for destroying information from the NAND flash memory. In the technical solution of the present application, the voltage boosted circuit exerts a device erase pulse to blocks of the flash array to permanently erase at least data in the power-on read blocks, and after the data are removed, the NAND flash memory cannot be used anymore. Therefore, the present invention discloses a method and NAND flash memory with data security function.

The above description is merely an overview of technical solutions of the present application. In order to more clearly understand the technical solutions of the present application to implement in accordance with the contents of the description, and to make the foregoing and other objects, features and advantages of the application more apparent, detailed embodiments of the application will be provided below.

BRIEF DESCRIPTION OF THE DRAWINGS

Through reading the detailed description of the following preferred embodiments, various other advantages and benefits will become apparent to those of ordinary skills in the art. Accompanying drawings are merely included for the purpose of illustrating the preferred embodiments and should not be considered as limiting of the application. Further, throughout the drawings, like elements are indicated by like reference numbers.

DETAILED DESCRIPTION OF THE EMBODIMENTS

Exemplary embodiments of the present application will be described in detail with reference to the accompanying drawings hereinafter.

First Embodiment

Figure 1:
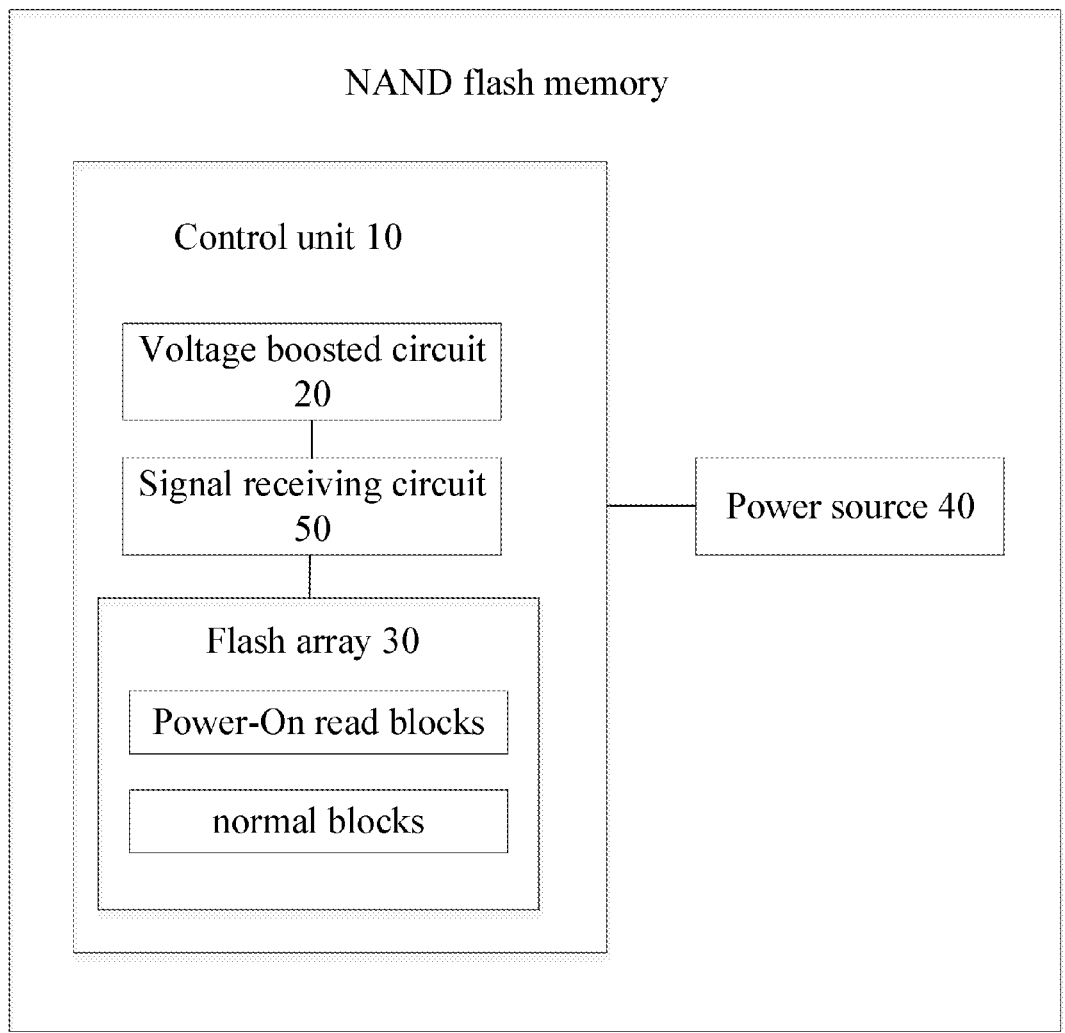
FIG. 1 is a schematic diagram showing the NAND flash memory according to an embodiment of the present invention.

FIG. 1 is a schematic diagram showing a NAND flash memory according to an embodiment of the present invention.

As shown in FIG. 1, the first embodiment of the present invention provides a NAND flash memory, which may include the control unit 10 and the power source 40 supplying power to the control unit 10. The control unit 10 includes a voltage boosted circuit 20 and a flash array 30.

The voltage boosted circuit 20 may be electrically connected to the flash array 30. The flash array 30 is usually composed of a plurality of blocks for storing binary data 0 and 1. Each block may include a filed effect transistor (FET) with a floating gate. The FET further includes a source, a drain, a control gate, which is not illustrated herein. When data in the flash array 30 needs to be erased, an erase voltage is applied to the FET to force the electrons to move, thereby removing the binary data stored in the blocks.

When the voltage boosted circuit 20 receives an erase signal, it may provide a device erase pulse with the magnitude higher than an initial voltage of the NAND flash memory to permanently erase the data in the flash memory and destroy the floating gate. The data in the flash memory may be power-on boot code and other system information. The initial voltage may be the working voltage of the NAND flash memory, such as 10 volts.

The control unit 10 may receive a device erase command from external devices (not shown) such as an external NAND controller. The control unit 10 decodes the device erase command after receiving it, and obtains a device erase signal, and then sends to the voltage boosted circuit 20. The voltage boosted circuit 20 may receive an erase signal, and then exerts a device erase pulse whose magnitude is higher than an initial voltage to the flash array 30 to permanently erase at least power-on boot code in the flash array and destroy the floating gate of the FET.

As shown in FIG. 1, in an alternative embodiment of the present invention, except for the voltage boosted circuit 20, the control unit 10 may further include the signal receiving circuit 50 for receiving a device erase command sent from the external device. For example, the external device, which may be a NAND controller, sends a device erase command to the control unit 10 of the NAND flash memory. The signal receiving circuit 50 may receive the device erase command from the external NAND controller, and once the signal receiving circuit 50 receives the device erase command, the control unit decodes the device erase command to obtain the device erase signal, and sends the device erase signal to the voltage boosted circuit 20 to exert the device erase pulse to permanently erase the power-on boot code in the flash array.

In an alternative embodiment of the present invention, the device erase pulse has a magnitude which may be more than twice of the initial voltage.

It should be noted that, the device erase pulse is named according to its function, which is to erase data permanently and ruins the NAND flash memory, it can also be called "ruined erase pulse".

There are two kinds of erase operation in NAND flash memory, which are normal erase and device erase. In normal erase, a plurality of regular erase pulses are sent to the normal blocks to erase data in the blocks of the flash array. On the contrary, in device erase, a device erase pulse with predetermined magnitude and predetermined pulse width is sent to the blocks, which include power-on read blocks and normal blocks, to erase data in the blocks. The power-on read blocks stores system information of the NAND flash memory such as power-on boot code. When the data in the power-on read blocks are erased, the NAND flash memory cannot be used anymore.

Table 1 is a contract table showing the parameters of normal erase and device erase according to an embodiment of the invention, as below.

TABLE 1

| mode | erase pulses | erase time | erase voltage |
| --- | --- | --- | --- |
| block erase | 3~10 | About 0.5 seconds | 10V~20V |
| device erase | 1 | 0.5~10 seconds | 20V~30V |

It should be noted that, the values in the above table is only an example, which is not used to limit the scope of the present invention.

According to the table above, in normal erase mode (also may be called block erase mode), generally the erase pulse is 3 to 10 pulses, and the erase time is about 0.5 seconds, and the erase voltage is 10V~20V. In the normal erase mode, normal data, which does not include the power-on boot code, is erased.

On the contrary, in the device erase mode, the erase pulse is one pulse with the pulse width 0.5 to 10 seconds, and the erase voltage is 20 to 30 volts. It can be seen that, the erase voltage is much larger than the normal block erase, and the device erase has only one erase pulse and has longer pulse width than the normal erase.

In an alternative embodiment of the present invention, the device erase pulse is a long-time erase pulse with the pulse width 0.5 seconds to 10 seconds.

In the embodiment, there is provided a NAND flash memory may have a fast and permanent way to erase the NAND flash memory, which avoids data leakage.

In preferred embodiments of the present invention, the NAND flash memory may include a power source for supplying power to other elements. The power source may be charge pumps which can boost up as higher voltage as it can, therefore the NAND flash controller may erase data without the aid of external power source. As a skilled person in the art should understand, the NAND flash memory may further include a read/program/erase state machine, a command decoder (control logic), timing controller, which are not illustrated herein for concise purpose.

According to the embodiment of the present application, there is disclosed a NAND flash memory. In the technical solution of the present application, the voltage boosted circuit exerts a device erase pulse to blocks of the flash array to permanently erase at least power-on boot code in the blocks, and after the power-on boot code are removed, the NAND flash memory cannot be used anymore. Therefore the present invention discloses a method and NAND flash memory with data security function.

Second Embodiment

Figure 2:
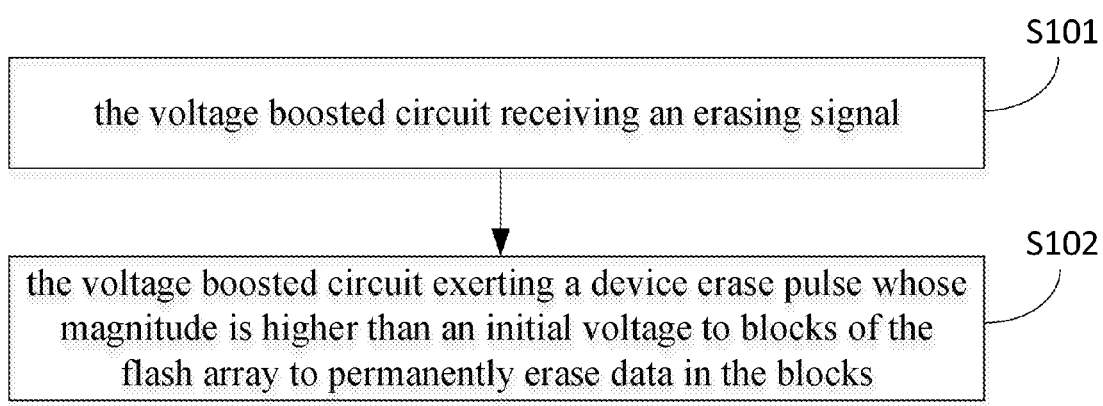
FIG. 2 is a flow chart showing the method for erasing the NAND flash memory according an embodiment of the present invention.

FIG. 2 is a flow chart showing the method for destroying information from a NAND flash memory. The NAND flash memory comprises a control unit and a power source supplying power to the control unit, the control unit includes a signal receiving circuit, a voltage boosted circuit and a flash array, the flash array includes a plurality of field effect transistors, each of which includes a floating gate.

As shown in FIG. 2, the method may include the following steps:

S101, the voltage boosted circuit receiving an erasing signal; and

S102, the voltage boosted circuit exerting a device erase pulse whose magnitude is higher than an initial voltage to blocks of the flash array to permanently erase data in the blocks.

Wherein, the blocks include power-on read blocks.

In step S101, the voltage boosted circuit of the control unit of the NAND flash memory may receive a device erase signal. The signal receiving circuit may receive a device erase command from external NAND controller. When receives the device erase command, it sends the device erase signal to the voltage boosted circuit.

In step S102, a device erase pulse whose magnitude is higher than the initial voltage of the NAND flash memory is exerted on the flash array to permanently erase the data in the flash array. The device erase pulse may be much larger than the initial voltage in order to make the data in the blocks to be FFh data, to achieve data erase.

The blocks herein include power-on read blocks and normal blocks. In an embodiment, only data in the power-on read blocks are erased. Since the data stored in the power-on read blocks are necessary for operating the NAND flash memory, such as the power-on boot code and other system information, after erase, the NAND flash memory cannot be used anymore. In other embodiments, it is preferable to select all the blocks in the NAND flash memory, and then remove data in all the blocks to permanently erase data and ensure data security.

In the embodiment, there is provided a method for destroying data in the NAND flash memory, it provides a fast and permanent way to erase data in the NAND flash memory, which avoids data leakage. According to the embodiment of the present application, the voltage boosted circuit exerts a device erase pulse to blocks of the flash array to permanently erase at least power-on boot code in the blocks, and after the power-on boot code are removed, the NAND flash memory cannot be used anymore. Therefore the present invention discloses a method and NAND flash memory with data security function.

Third Embodiment

Figure 3:
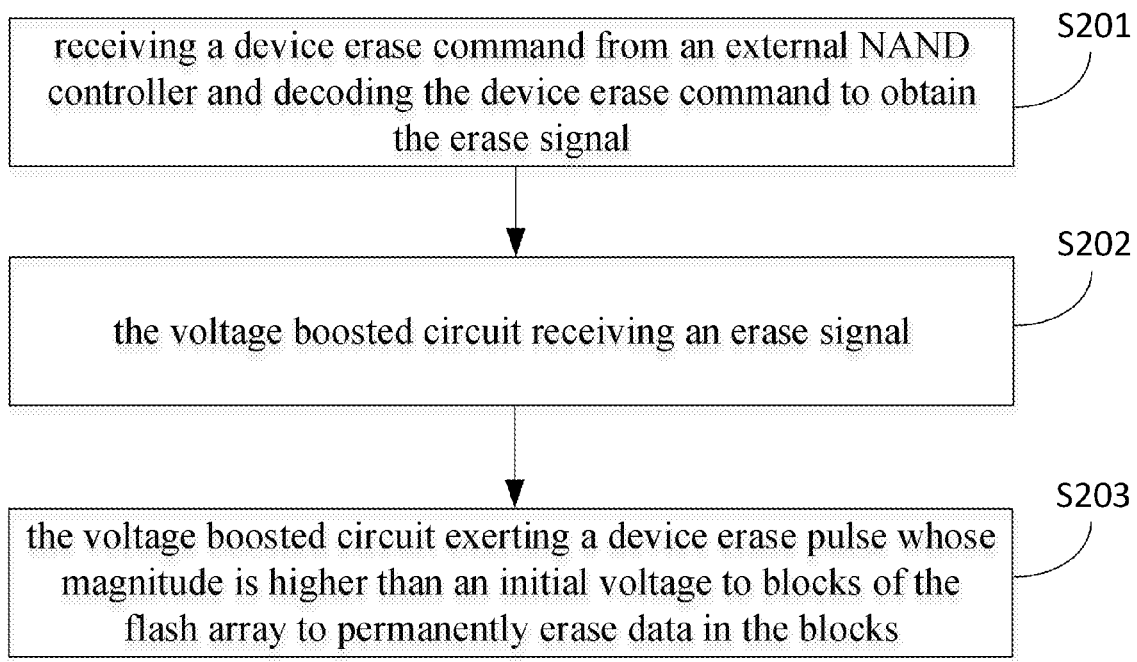
FIG. 3 is a flow chart showing the method for erasing the NAND flash memory according to another embodiment of the present invention.

FIG. 3 is a flow chart showing the method for erasing a NAND flash memory in another embodiment. As shown in FIG. 3, the method may include the following steps:

S202, the voltage boosted circuit receiving an erase signal; and

S203, the voltage boosted circuit exerting a device erase pulse whose magnitude is higher than an initial voltage to blocks of the flash array to permanently erase data in the blocks;

wherein the blocks include power-on read blocks.

In step S202, the voltage boosted circuit of the control unit of the NAND flash memory may receive a device erase signal decoded by the control unit.

In one embodiment, the control unit includes a signal receiving unit. The signal receiving circuit may receive a device erase command from external NAND controller. When receives the device erase command, it send the device erase signal to the voltage boosted circuit.

In step S203, a device erase pulse whose magnitude is higher than the initial voltage of the NAND flash memory is exerted on the blocks of the flash array to permanently erase the data in the flash array.

The magnitude of the device erase pulse may be larger than the initial voltage in order to make the data in the blocks to be FFh data, to achieve data erase. For example, the magnitude of the device erase pulse may be twice of the initial voltage, or even ten times of the initial voltage.

In an embodiment of the present application, before step S202 is performed, the method may further include step S201 as below.

S201, receiving a device erase command from an external NAND controller and decoding the device erase command to obtain the erase signal.

In step S201, the external NAND controller sends a device erase command to the control unit of the NAND flash memory. The control unit receives the device erase command and decodes the device erase command to be the device erase signal. In one embodiment, the control unit may have the signal receiving circuit to receive the device erase command, but it is not limited thereto. After decoding, the control unit sends the device erase signal to the voltage boosted circuit, as in step S202.

The erase signal includes three sub-signals, which are a voltage boost sub-signal, an erase pulse timing sub-signal and a block selecting sub-signal. The voltage boost sub-signal is used to boost the erase pulse up to a much higher voltage than the initial voltage, such as twice of the initial voltage or ten times of the initial voltage. The erase pulse timing sub-signal is used to set the pulse width, for example, the pulse width may be set as 0.5 second to 5 seconds. The block selecting sub-signal is used to select the blocks in which data needs to be removed. In some embodiments, the block selecting sub-signal may select the power-on read blocks, and in other embodiments, the block selecting sub-signal may preferably select all the blocks including power-on read blocks and normal blocks.

In the embodiment, there is provided a method for destroying data from the NAND flash memory may have a fast and permanent way to erase the NAND flash memory, which avoids data leakage. According to the embodiment of the present application, the voltage boosted circuit exerts a device erase pulse to blocks of the flash array to permanently erase at least the data in the power-on read blocks, and after the data are removed, the NAND flash memory cannot be used anymore. Therefore the present invention discloses a method and NAND flash memory with data security function.

The "an embodiment", "embodiments" or "one or more embodiments" mentioned in the disclosure means that the specific features, structures or performances described in combination with the embodiment(s) would be included in at least one embodiment of the present application. Moreover, it should be noted that, the wording "in an embodiment" herein may not necessarily refer to the same embodiment.

Many details are discussed in the specification provided herein. However, it should be understood that the embodiments of the disclosure may be implemented without these specific details. In some examples, the well-known methods, structures and technologies are not shown in detail so as to avoid an unclear understanding of the description.

It should be noted that the above-described embodiments are intended to illustrate but not to limit the present application, and alternative embodiments may be devised by the person skilled in the art without departing from the scope of claims as appended. In the claims, any reference symbols between brackets form no limit of the claims. The wording "include" does not exclude the presence of elements or steps not listed in a claim. The wording "a" or "an" in front of an element does not exclude the presence of a plurality of such elements. The disclosure may be realized by means of hardware comprising a number of different components and by means of a suitably programmed computer. In the unit claim listing a plurality of devices, some of these devices may be embodied in the same hardware. The wordings "first", "second", and "third", etc. do not denote any order. These wordings may be interpreted as a name.

Also, it should be noticed that the language used in the present specification is chosen for the purpose of readability and teaching, rather than explaining or defining the subject matter of the present application. Therefore, it is obvious for an ordinary skilled person in the art that modifications and variations could be made without departing from the scope and spirit of the claims as appended. For the scope of the present application, the publication of the inventive disclosure is illustrative rather than restrictive, and the scope of the present application is defined by the appended claims.

What is claimed is:

1. A NAND flash memory, comprising:
   a control unit, wherein the control unit includes a signal receiving circuit, a voltage boosted circuit and a flash array;
   a power source supplying power to the control unit;
   wherein the signal receiving circuit is configured to transmit an erase signal to the voltage boosted circuit; the voltage boosted circuit configured to exert a device erase pulse of a magnitude larger than an initial voltage to blocks of the flash array to permanently erase data in the blocks and destroy a floating gate; the blocks include power-on read blocks and the erase signal comprises three sub-signals including a voltage boost sub-signal, an erase pulse timing sub-signal and a block selecting sub-signal; the voltage boost sub-signal sets the magnitude of the device erase pulse; the erase pulse timing sub-signal sets a pulse width of the device erase pulse; and the block selecting sub-signal selects the blocks of the flash array to permanently erase data.

2. The NAND flash memory according to claim 1, wherein the signal receiving circuit is configured to receive a device erase command from an external NAND controller.

3. The NAND flash memory according to claim 1, wherein the pulse width of the device erase pulse is 0.5 seconds to 10 seconds.

4. The NAND flash memory according to claim 1, wherein the device erase pulse magnitude is between 20 volts and 30 volts.

5. The NAND flash memory according to claim 1, wherein the device erase pulse is a single erase pulse.

6. The NAND flash memory according to claim 1, wherein the control unit receives a device erase command and the control unit decodes the device erase command.

7. A method for destroying information from a NAND flash memory, the method comprising:
   receiving an erase signal by a voltage boosted circuit;
   the voltage boosted circuit exerting a device erase pulse of a magnitude higher than an initial voltage to blocks of a flash array to permanently erase data in the blocks and destroy a floating gate;
   wherein the NAND flash memory comprises a control unit, and a power source supplying power to the control unit;
   wherein the control unit includes a signal receiving circuit, the voltage boosted circuit and the flash array;
   wherein the signal receiving circuit transmits the erase signal to the voltage boosted circuit;
      the blocks include power-on read blocks and the erase signal comprises three sub-signals including a voltage boost sub-signal, an erase pulse timing sub-signal and a block selecting sub-signal; the voltage boost sub-signal sets the magnitude of the device erase pulse; the erase pulse timing sub-signal sets a pulse width of the device erase pulse; and the block selecting sub-signal selects the blocks of the flash array to permanently erase data.

8. The method according to claim 7, wherein the method further comprises an external NAND controller sending a device erase command to the signal receiving circuit.

9. The method according to claim 7, wherein the pulse width of the device erase pulse is 0.5 seconds to 5 seconds.

10. The method according to claim 7, wherein the device erase pulse magnitude is between 20 volts 30 volts.

11. The method according to claim 7, wherein the device erase pulse is a single erase pulse.

12. The method according to claim 7, wherein the control unit receives a device erase command and the control unit decodes the device erase command.

* * * * *